(12) United States Patent
Fechner et al.

(10) Patent No.: US 7,964,897 B2
(45) Date of Patent: Jun. 21, 2011

(54) DIRECT CONTACT TO AREA EFFICIENT BODY TIE PROCESS FLOW

(75) Inventors: Paul S. Fechner, Plymouth, MN (US); Bradley Larsen, Mound, MN (US); Gregor Dougal, Minneapolis, MN (US); Keith Golke, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 252 days.

(21) Appl. No.: 12/177,332

(22) Filed: Jul. 22, 2008

(65) Prior Publication Data
US 2010/0019320 A1    Jan. 28, 2010

(51) Int. Cl.
H01L 29/76    (2006.01)
H01L 21/335    (2006.01)

(52) U.S. Cl. ........... 257/213; 257/E21.385; 257/E21.42; 257/E29.281; 438/142

(58) Field of Classification Search ........... 257/347, 257/E21.415, E21.703, E27.112, E29.281, 257/E21.385, E21.42; 438/154, 17, 296, 438/163, 164, 142, 666, 233
See application file for complete search history.

(56) References Cited

U.S. PATENT DOCUMENTS

| | | | |
|---|---|---|---|
| 4,489,339 A | 12/1984 | Uchida | 357/23 |
| 4,786,955 A | 11/1988 | Plus et al. | 357/23.7 |
| 4,809,056 A | 2/1989 | Shirato et al. | 357/71 |
| 5,145,802 A | 9/1992 | Tyson et al. | 437/63 |
| 5,767,549 A | 6/1998 | Chen et al. | 257/347 |
| 6,521,959 B2 | 2/2003 | Kim et al. | 257/397 |
| 6,537,861 B1 | 3/2003 | Kroell et al. | 438/149 |
| 6,638,799 B2 | 10/2003 | Kotani | 438/154 |
| 6,724,048 B2 | 4/2004 | Min et al. | 257/347 |
| 6,864,152 B1 | 3/2005 | Mirbedini et al. | 438/427 |
| 6,953,809 B2 | 10/2005 | Faull et al. | 514/339 |
| 6,960,810 B2 | 11/2005 | Fechner | 257/351 |
| 7,179,717 B2 | 2/2007 | Sandhu et al. | |
| 2002/0123205 A1 | 9/2002 | Iwamatsu et al. | |
| 2003/0020117 A1 | 1/2003 | Lee et al. | 357/347 |
| 2003/0025135 A1 | 2/2003 | Matsumoto et al. | |
| 2004/0129975 A1 | 7/2004 | Koh et al. | 257/347 |
| 2005/0269637 A1 | 12/2005 | Iwamatsu et al. | 257/347 |
| 2007/0181946 A1 | 8/2007 | Mathew et al. | |
| 2007/0257317 A1 | 11/2007 | Fechner et al. | 257/351 |

FOREIGN PATENT DOCUMENTS

DE    101 06423 A1    2/2002
EP    0 225 821 A2    6/1987

(Continued)

OTHER PUBLICATIONS

European Search Report from corresponding EP Application No. 09160633.5, mailed Nov. 16, 2009, 6 pages.

(Continued)

Primary Examiner — Thomas L Dickey
Assistant Examiner — Nikolay Yushin
(74) Attorney, Agent, or Firm — Schumaker & Sieffert, P.A.

(57) ABSTRACT

A process flow for fabricating shallow trench isolation (STI) devices with direct body tie contacts is provided. The process flow follows steps similar to standard STI fabrication methods except that in one of the etching steps, body tie contacts are etched through the nitride layer and STI oxide layer, directly to the body tie. This process flow provides a direct body tie contact to mitigate floating body effects but also eliminates hysteresis and transient upset effects common in non-direct body tie contact configurations, without the critical alignment requirements and critical dimension control of the layout.

20 Claims, 4 Drawing Sheets

FOREIGN PATENT DOCUMENTS

| | | |
|---|---|---|
| GB | 2 360 874 A | 10/2001 |
| WO | WO 02/25701 A2 | 3/2002 |

OTHER PUBLICATIONS

Wolf, Silicon Processing for the BLSI Era, vol. 2: Process Integration, 1990 by Lattice Press, pp. 143-147.

European Examination Report from corresponding EP Application No. 09160633, mailed Feb. 25, 2010, 1 page.

International Search Report for PCT/US2007/002774 dated Nov. 6, 2007.

Min, B.W., et al., "Partial Trench Isolated Body-Tied (PTIBT) Structure for SOI Applications," Oct. 2001, IEEE International SOI Conference, pp. 71-72.

DIRECT CONTACT TO AREA EFFICIENT BODY TIE PROCESS FLOW

GOVERNMENT RIGHTS

The United States Government has acquired certain rights in the invention pursuant to Contract No. DTRA01-03-D-0018-0006 with the Defense Threat Reduction Agency.

RELATED APPLICATION

The present application is related to U.S. patent application Ser. No. 11/415,703, filed May 2, 2006, entitled "Method of Forming a Body-Tie" which is assigned to the assignee of the present invention and incorporated by reference herein, in its entirety.

FIELD OF THE INVENTION

The present invention relates to Field Effect Transistor (FET) fabrication processes, and more particularly, to a process flow providing direct contact to the body tie silicon.

BACKGROUND

One issue that FETs fabricated in a Silicon on Insulator (SOI) substrate may experience is a floating body effect. In such FETs, floating body effects are a result of having a body region that is electrically isolated from a bulk substrate. In order to supply a voltage potential to the body, and therefore mitigate floating body effects, an applied bias is often supplied from a body-contact to the body. When a body-contact receives an applied bias, which may be a ground or a positive or negative potential, it carries it to the body via a body tie. Often, the body-tie is formed in device layer silicon and runs beneath an oxide, and in general, the body tie allows the body region and the body-contact to be in remote locations in an SOI substrate.

Conventional SOI devices without body ties are susceptible to hysteresis and transient upset effects. Body tie contacts can help control the hysteresis and transient upset effects, but the layout density of current area efficient body tie fabrication process flows is limited by the n or p masking layer alignment and critical dimension control in order to contact the body tie. As such, a fabrication process flow that eliminates the critical alignment and dimension control requirements to improve the layout density, while mitigating body effects, is desired.

SUMMARY

In an exemplary embodiment, a process flow for fabricating a shallow trench isolation (STI) device with direct body tie contact is provided. The process flow follows steps similar to standard STI fabrication methods except that in one of the etching steps, an opening is etched through the nitride mask and STI oxide layer, directly to the body tie silicon. This adjustment in the process flow allows contacts to be directly landed on the body tie, thus addressing the issues related to floating body effects by providing a direct body contact that eliminates hysteresis and transient upset effects common in non body contact configurations, without the critical alignment requirements and critical dimension control of the layout as in previous body contact configurations.

DETAILED DESCRIPTION

Figure 1:
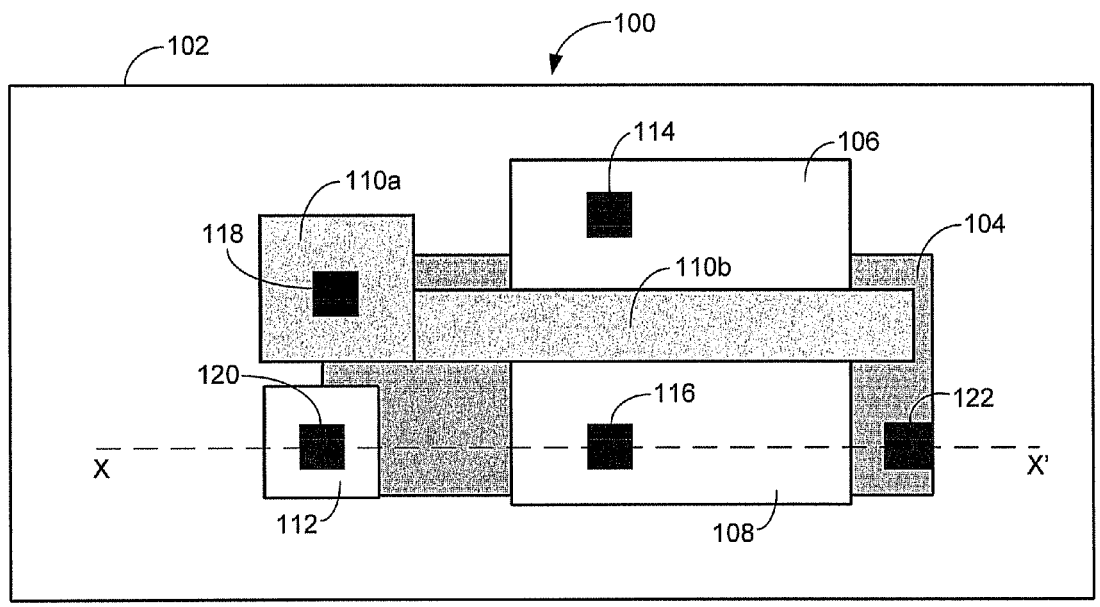
FIG. 1 is a pictorial diagram illustrating a top view of the layout configuration with direct body tie contact, according to an embodiment of the present invention.

FIG. 1 is a pictorial diagram illustrating a top view of the layout configuration of a Shallow Trench Isolation (STI) device 100. The STI device 100 comprises a buried oxide layer 102, over which an n+ drain 106, n+ source 108 and p+ tap 112 are formed with a body tie layer 104 in between. A gate 110a,b is formed between the n+ drain 106 and n+ source 108 regions. Each of the n+ drain 106, n+ source 108, gate 110 and p+ tap 112 are accessed via contacts 114, 116, 118, and 120 respectively.

Note that the layout configuration of the STI device 100 has a body contact in a separate active area 112 from the source and drain. Unless the body tie silicon 104 is electrically connected by the standard contact 120 through the p+ tap 112 or the direct body tie contact 122, the STI device 100 may be susceptible to hysteresis and transient upset effects. However, a direct body tie contact 122 provides a direct connection to the body tie 104 eliminating the need for critical alignment and dimension control requirements in the n+/p+ lithography processes as well as the elimination of the p+ tap 112 feature. This improves the layout density while reducing the cost of the n+/p+ lithography steps.

Figure 3:
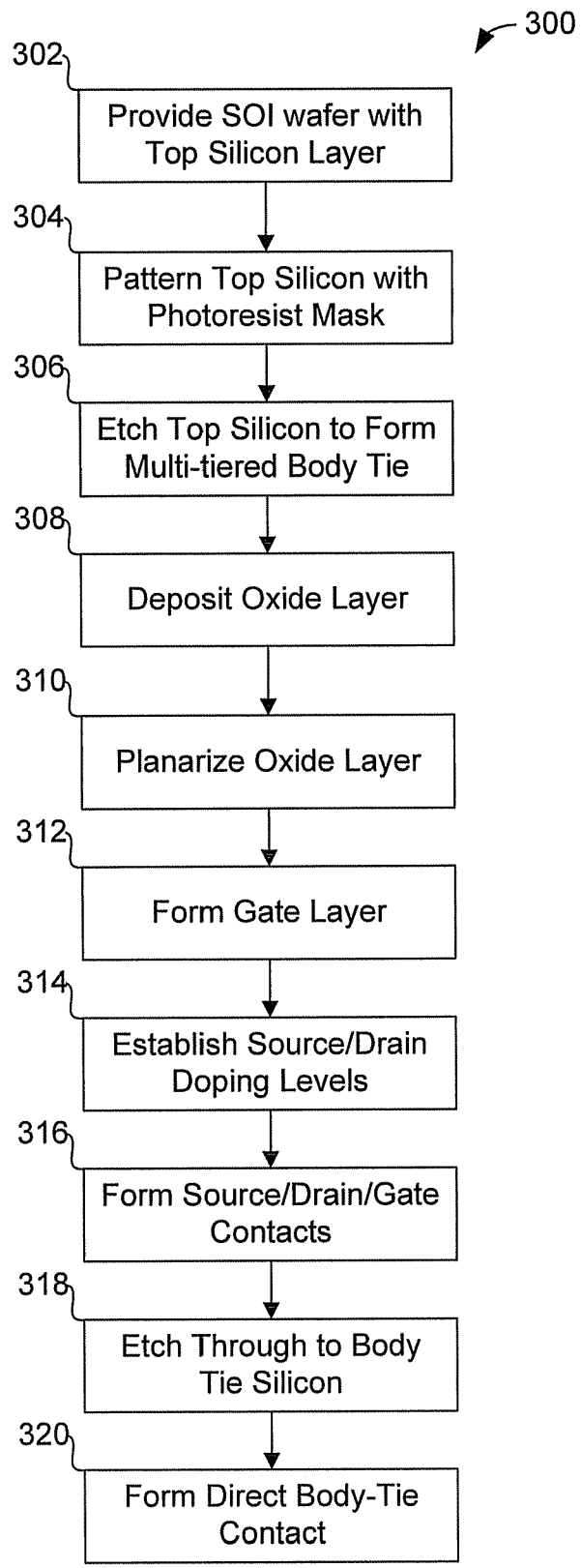
FIG. 3 is a flow diagram of an STI scheme, according to an embodiment of the present invention.

FIG. 3 is a flow diagram of an STI scheme 300, according to an embodiment of the present invention. The fabrication process flow of the STI device 100 begins with the step of providing an SOI wafer with a top silicon layer 302, followed by the step of patterning the top silicon with a photoresist mask 304. Once the hardmask is formed, two separate silicon etching steps 306 are performed to form the multi-tiered body tie 104 structure. After the structures are formed, the steps of oxide deposition 308 and oxide planarization 310 are performed, after which the forming of a gate oxide and polysilicon gate layer 312 step takes place. After the formation of the gate layer, doping levels of the n+ drain 106 and n+ source 108 are established 314 by a series of implants. This series of implants requires separate masks for n+ doping and p+ doping. After the establishment of the source and drain doping levels 314, the formation of contacts 316 takes place. A drain contact 114, a source contact 116, a gate contact 118 and a p+ tap contact 120 are formed at the drain region 106, the source 108 region, the gate region 110 and the p+ tap region 112, respectively.

At this point, an additional step of etching through to the body tie silicon 318 is included. An opening is etched through the nitride etch-stop layer down to the body tie silicon 104, after which a direct contact 122 to the body-tie 104 is formed 320. This adjustment to the process flow removes the requirement that a body tie contact must occur in a normal active area, which is a feature that must be lithographically designated in the active area masking and etch steps, the n+ and p+ masking and doping steps, and the implantation step.

Figure 2A:
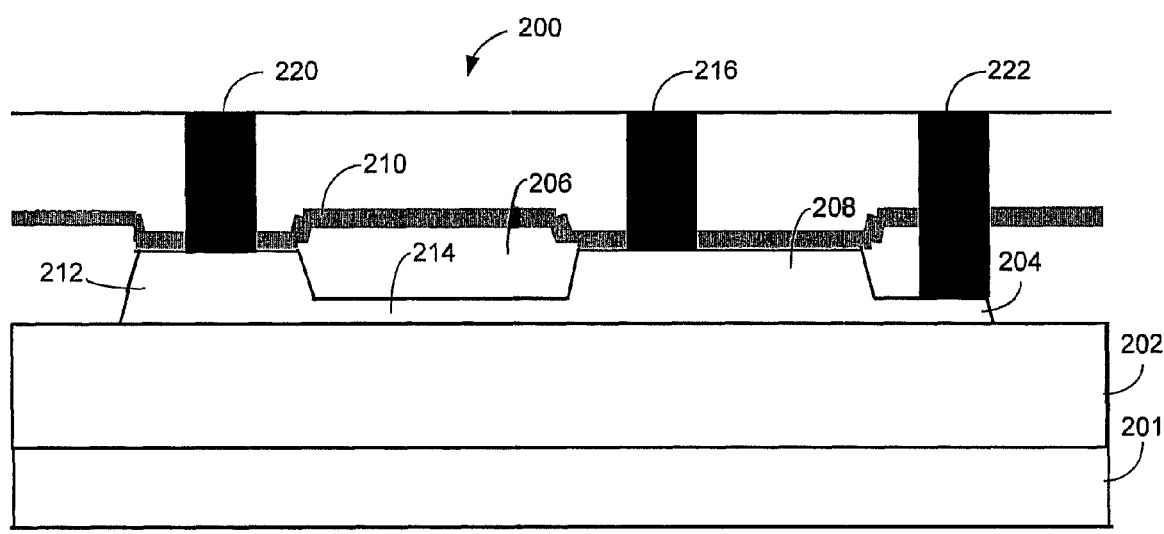
FIG. 2a is a pictorial diagram of a cross-section cut through the top view of FIG. 1, according to an embodiment of the present invention.

FIG. 2a is a pictorial diagram of the cross-section cut through along the X-X' plane of the STI device configuration shown in FIG. 1. Buried oxide layer 202 isolates the device silicon areas 204, 208, 212 and 214 from the silicon substrate 201. A deposited and subsequently CMP planarized oxide 206 comprises the STI oxide isolation. The n+ source 208, p+ tap 212 and multi-tiered body tie 204 structures correspond to the n+ source 108 region, p+ tap 112 region, and body tie 104 region in FIG. 1, respectively. The multi-tiered body tie structure 204 is formed by two separate silicon etches as described above. A layer of silicon 214 remains after the silicon etches. A nitride layer 210 provides a hard mask etch stop for potential subsequent processing steps and the STI oxide layer 206 blocks the n+ and p+ source and drain implants from doping the underlying body tie silicon layer 214.

P+ contact 220, n+ source contact 216, and direct body tie contact 222 correspond to p+ tap contact 120, n+ source contact 116 and direct body tie contact 122 in FIG. 1, respectively. As shown, p+ tap contact 220 and n+ source contact 216 connects to the p+ tap 212 and n+ source 208 respectively by etching through the nitride layer 210. The direct body tie contact 222 connects to the body tie 204 by etching through the nitride layer as well as the STI oxide layer. The direct body tie contact 222 is oriented vertically and of unitary construction. The interface of where the direct contact occurs is such that a least a portion of the direct body tie contact 222 overlays at least a portion of the body tie structure 204. In an alternative embodiment, if the selectivity to the source, drain, or gate contact areas are not sufficient to etch to the body tie, then the body tie contact lithography etch can be done before the source, drain and gate contacts are formed.

Figure 2B:
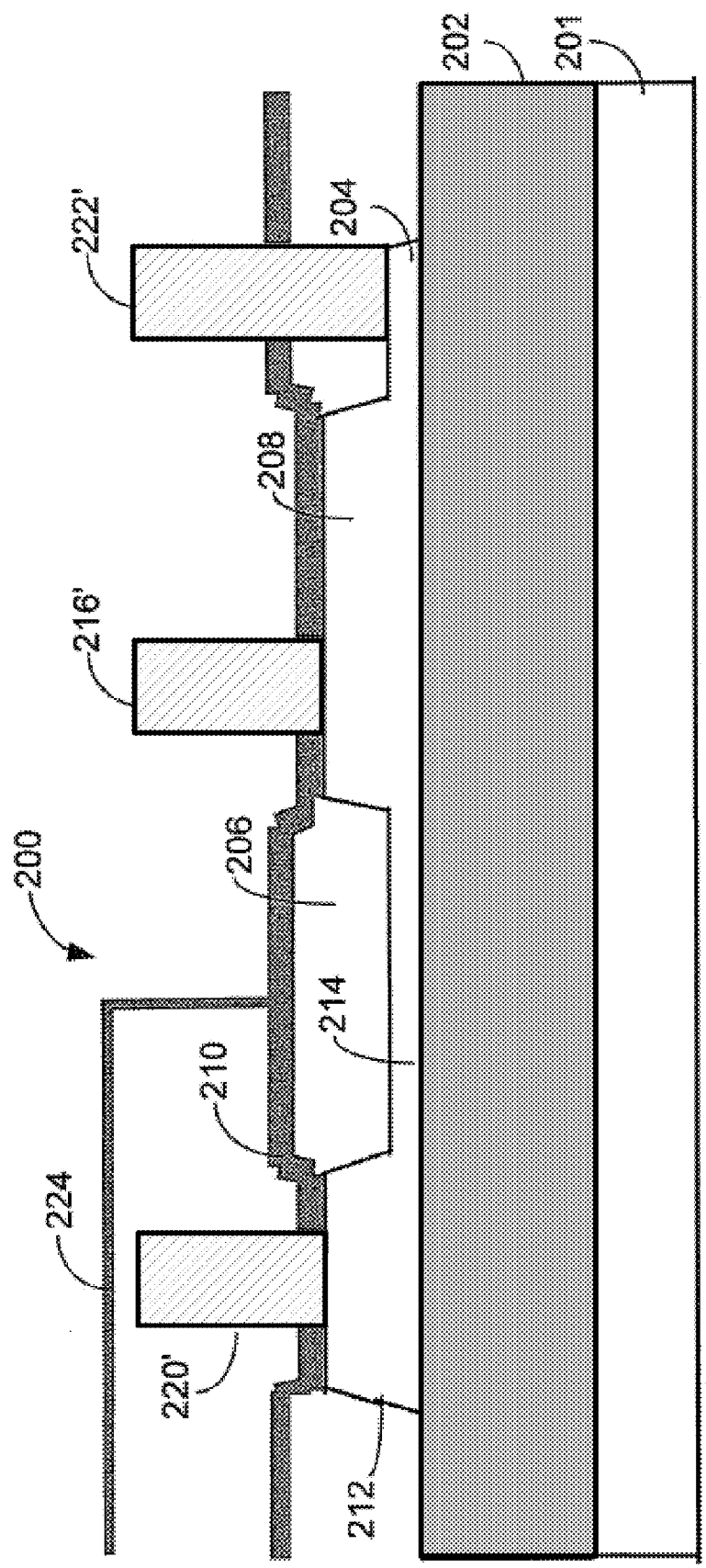
FIG. 2b is a pictorial diagram of a cross-section cut through the top view of FIG. 1 during an n+ implant step, according to an embodiment of the present invention.

In another alternative embodiment, the p+ tap feature can be eliminated in this direct body tie contact configuration, since it is no longer needed. Eliminating the p+ tap feature also eliminates the need for a photoresist mask feature at a minimum design rule distance from the n-channel transistor during the n+ implant. FIG. 2b is a pictorial diagram of the cross-section cut through along the X-X' plane of the STI device configuration shown in FIG. 1, during an n+ implant step. For reference, the columns 220', 216', and 222' are where contacts 220, 216 and 222 will be formed in a later step, as shown in FIG. 2a. The photoresist 224 is necessary when a p+ tap feature is implemented, but can be left out in this alternative embodiment. As such, eliminating the p+ tap feature can improve the density as well as reduce the lithography costs of the device.

Further, an additional lithography and implant step can be performed after the direct body tie contact has been formed to increase the doping in the direct body tie contact to reduce contact resistance. In this case, the direct body tie contact implants only go into the contact areas so n+ and p+ spacing requirements are still relaxed. Note that dopant activation to improve performance can optionally occur in a typical contact TiN liner anneal step. In view of the various embodiments of the present invention, the best case scenario requires no additional processing, and the worst case scenario requires one additional contact mask and etch step, and two reuses of well masks during two additional implants.

Although the presented method has been described with reference to an STI scheme in an SOI process, it may, however, be carried out at other points of an SOI process. The presented direct body-tie contact may be particularly advantageous in radiation hardened circuits. However, it is also contemplated that such a body-tie may also be used where appropriate in a non-radiation hardened circuit. It should be understood, therefore, that the illustrated examples are examples only and should not be taken as limiting the scope of the present invention. Also, the claims presented below should not be read as limited to the described order or elements unless stated to that effect. Therefore, all examples that come within the scope and spirit of the following claims and equivalents thereto are claimed as the invention.

The invention claimed is:

1. A semiconductor device having a multi-tiered structure comprising:
    a multi-tiered silicon layer with a body tie;
    an oxide layer overlaying the multi-tiered silicon layer with a body tie;
    a first contact formed to at least one of a source or drain region of the semiconductor device, the first contact formed to a first depth; and
    a second contact formed to the body tie, the second contact formed to a second depth different than the first depth.

2. The semiconductor device of claim 1, further comprising source, drain and gate regions.

3. The semiconductor device of claim 2, wherein the source and drain are n-type.

4. The semiconductor device of claim 2, wherein the source and drain are p-type.

5. The semiconductor device of claim 1, wherein a least a portion of the second contact overlays at least a portion of the body tie.

6. The semiconductor device of claim 1, wherein the second contact is vertically oriented.

7. The semiconductor device of claim 1, wherein the second contact is of unitary construction.

8. A method for fabricating a semiconductor device comprising:
    providing an SOI wafer with a top silicon layer;
    patterning the top silicon layer;
    etching the top silicon layer to form multi-tiered body tie, source, and drain structures;
    depositing an oxide layer over the multi-tiered body tie, source, and drain structures;
    planarizing the oxide layer;
    patterning and forming a gate layer;
    establishing doping levels in the source and drain structures via implants;
    forming contacts to the source, drain, and gate structures;
    etching through portions of the oxide layer and multi-tiered silicon structure to the body tie structure; and
    forming a body tie contact directly to the multi-tiered body tie structure.

9. The method of claim 8, wherein the body tie contact is oriented vertically.

10. The method of claim 8, wherein the body tie contact is of unitary construction.

11. The method of claim 8, wherein at least a portion of the body tie contact overlays at least a portion of the multi-tiered body tie structure.

12. The methods of claim 8, further comprising performing dopant implantation after the contacts to the source, drain, and gate structures have been formed to reduce contact resistance.

13. The method of claim 8, wherein etching the top silicon layer to form the multi-tiered body tie, source and drain structures comprises at least two separate etching steps.

14. A method for fabricating a semiconductor device comprising:
    fabricating source and drain active regions;
    fabricating a multi-tiered body tie structure; and
    forming a first contact coupled to one or more of the source and drain active regions, the first contact formed to a first depth; and forming a second contact coupled to at least a portion of the multi-tiered body tie structure, the second contact formed to a second depth different than the first depth.

15. The method as in claim 1, further comprising etching through any intermediate layers such that the second contact can directly couple with the at least a portion of the multi-tiered body tie structure.

16. The method of claim 1, wherein the second contact is vertically oriented.

17. The method of claim 1, wherein the second contact is of unitary construction.

18. The method of claim 1, wherein at least a portion of the second contact overlays at least a portion of the multi-tiered body tie structure.

19. The method as in claim 1, further comprising performing dopant implantation after the second contact has been formed to reduce contact resistance.

20. The method as in claim 1, wherein fabricating a multi-tiered body tie structure comprises at least two separate etching steps.

* * * * *

UNITED STATES PATENT AND TRADEMARK OFFICE
CERTIFICATE OF CORRECTION

| | | |
|---|---|---|
| PATENT NO. | : 7,964,897 B2 | Page 1 of 1 |
| APPLICATION NO. | : 12/177332 | |
| DATED | : June 21, 2011 | |
| INVENTOR(S) | : Fechner et al. | |

It is certified that error appears in the above-identified patent and that said Letters Patent is hereby corrected as shown below:

Column 4, line 19 (Claim 5), "wherein a least" should be -- wherein at least --

Signed and Sealed this
Third Day of July, 2012

David J. Kappos
*Director of the United States Patent and Trademark Office*